(12) United States Patent
Wells et al.

(10) Patent No.: US 10,212,850 B1
(45) Date of Patent: Feb. 19, 2019

(54) ELECTRONIC DEVICE WITH HEAT SINK FLANGE AND RELATED METHODS

(71) Applicant: Eagle Technology, LLC, Melbourne, FL (US)

(72) Inventors: Robert G. Wells, Melbourne, FL (US); Bernie J. Gilley, West Melbourne, FL (US); Donald S. George, Melbourne, FL (US); William Joel Dietmar Johnson, Palm Bay, FL (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 0 days.

(21) Appl. No.: 15/952,413

(22) Filed: Apr. 13, 2018

(51) Int. Cl.
*H05K 7/14* (2006.01)
*H05K 7/20* (2006.01)

(52) U.S. Cl.
CPC ......... *H05K 7/2039* (2013.01); *H05K 7/1404* (2013.01); *H05K 7/1417* (2013.01); *H05K 7/1427* (2013.01); *H05K 7/20336* (2013.01)

(58) Field of Classification Search
CPC .. H05K 7/1404; H05K 7/1417; H05K 7/1427; H05K 7/20336; H05K 7/2039
See application file for complete search history.

(56) References Cited

U.S. PATENT DOCUMENTS

| 4,793,405 A | 12/1988 | Diggelmann et al. |
| 5,859,764 A | 1/1999 | Davis et al. |
| 7,031,167 B1 | 4/2006 | Zagoory et al. |
| 7,158,381 B2 | 1/2007 | MacGregor |
| 7,483,271 B2 | 1/2009 | Miller et al. |
| 8,451,600 B1 * | 5/2013 | Ross .................. H05K 7/20545 361/679.47 |
| 8,854,818 B1 * | 10/2014 | Angelucci ............ H05K 7/1402 165/104.33 |
| 9,307,629 B2 * | 4/2016 | Tissot .................. H05K 1/0201 |
| 9,826,662 B2 * | 11/2017 | Kim ........................ F28F 21/08 |
| 9,839,116 B2 * | 12/2017 | Kirk ..................... H05K 7/1404 |
| 2007/0253169 A1 | 11/2007 | Clawser |

OTHER PUBLICATIONS

Yeh et al. "An experimental investigation of thermal contact conductance across bolted joints" Expiremental Thermal and Fluid Science 25 (2001) 349-357.

(Continued)

*Primary Examiner* — Adrian S Wilson
(74) *Attorney, Agent, or Firm* — Allen, Dyer, Doppelt, + Gilchrist, P.A.

(57) ABSTRACT

An electronic device may include an electronic device chassis having first fastener openings, and circuit boards, each circuit board having opposing sides. The electronic device may include a respective heat sink flange extending outwardly from each opposing side of each circuit board. Each heat sink flange may have second fastener openings. The electronic device may have a respective fastening arrangement coupling each heat sink flange to adjacent portions of the electronic device chassis. Each fastening arrangement may include a fastener receiving strip having fastener receiving passageways, and fasteners extending through respective ones of the first and second fastener openings into corresponding ones of the fastener receiving passageways in the fastener receiving strip.

21 Claims, 12 Drawing Sheets

(56) References Cited

OTHER PUBLICATIONS

"SW7-475-260-365-764-CC" WaveTherm: http://www.wavetherm.com. retreived from internet Apr. 12, 2018; pp. 2.
"Coollok Electronic Card Retainers" Series 3.x Retainer for High Heat Flux Electronic Modules: Model No. CL30409-FI-HE-IA; http://www.google.com/url?sa=t&rct=j&q=&esrc=s&source=web&cd=1&ved=
0ahUKEwj5147ZtLXaAhXSvVMKHUCUBVkQFggpMAA&url=http%3A%2F%2Fns14.webmasters.com%2F*matinnovations.com%2Fhttpdocs%2FCoolok_Spec_Sheet_REv_H_Final.pdf&usg=AOvVaw2GnQyjvZ8q2Tk_lkn81SX1 retrieved from internet Apr. 12, 2018; pp. 2.

* cited by examiner

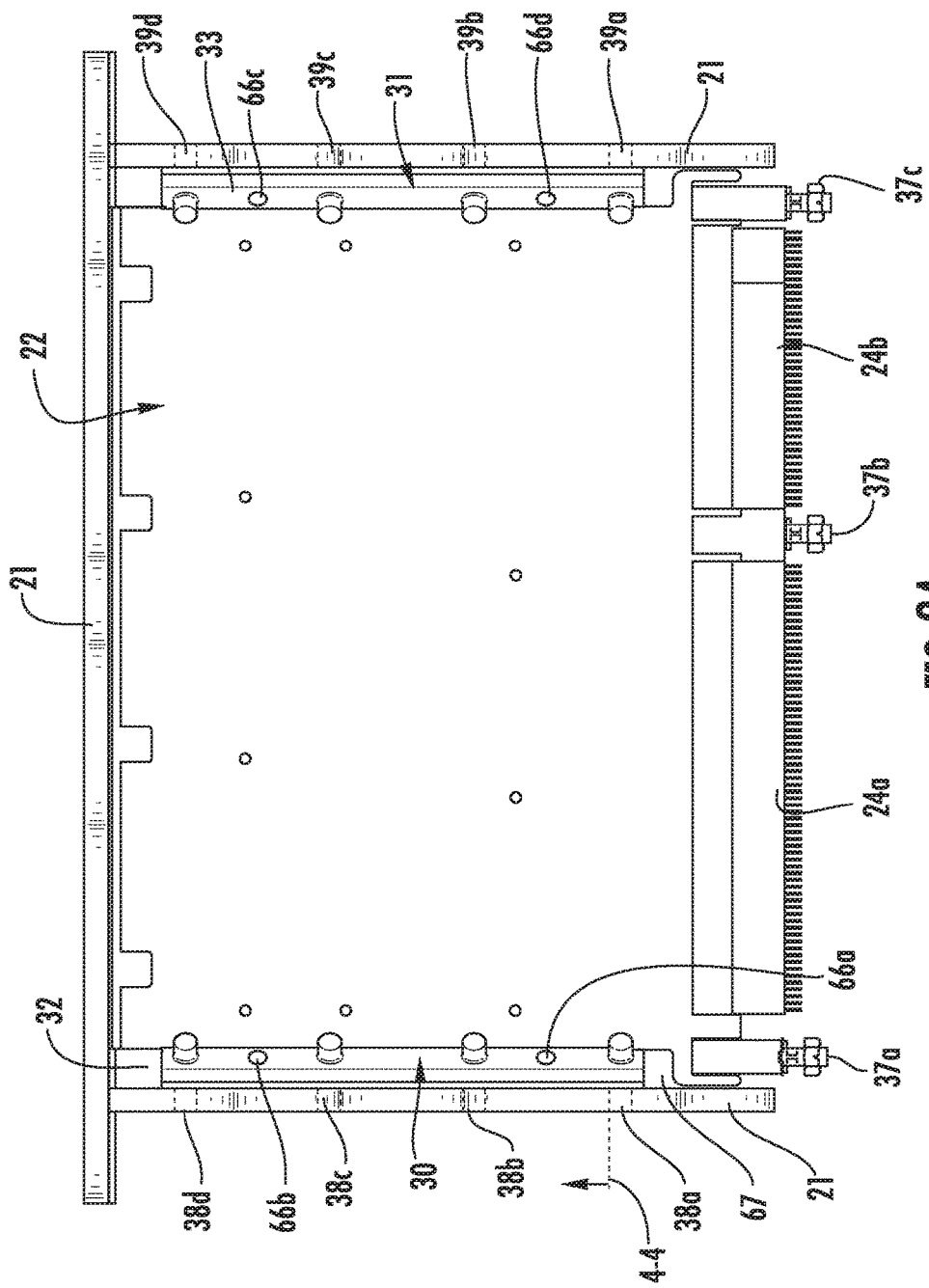

ELECTRONIC DEVICE WITH HEAT SINK FLANGE AND RELATED METHODS

GOVERNMENT RIGHTS

This invention was made with government support. The government has certain rights in the invention.

TECHNICAL FIELD

The present disclosure relates to the field of electronic devices, and, more particularly, to electronic devices with enhanced conductive cooling heat sinks and related methods.

BACKGROUND

An electronic device may include one or more circuit card modules inserted into a chassis and electronically coupled to a backplane of the electronic device. A typical circuit card module includes one or more circuit boards mounted to a heat sink structure. A typical circuit board is a planar board that mechanically supports electronic components. The electronic components may comprise, for example, resistors, capacitors, switches, batteries, and other more complex integrated circuit components, i.e. microprocessors. The circuit board typically comprises a dielectric material, for example, a plastic material.

A simple circuit board may include conductive traces on its surface for connecting the electronic components to each other. As electronic circuitry has become more complex, multi-layer circuit boards with at least two electrically conductive trace layers sandwiched between dielectric layers have been developed. Typically, the different conductive trace layers of the multi-layer circuit board may be connected through vertically extending vias, which comprise conductive materials, for example, metal.

A typical backplane includes conductive traces sandwiched between dielectric layers similar to the circuit board construction. The backplane may allow two or more circuit card modules to interconnect through electrically conductive pads on the major surfaces thereof. In other words, the edge surface of the circuit card module is mounted onto the major surface of the backplane at a 90 degree angle. Moreover, this interconnection is typically accomplished using an interconnector component on the major surface of the circuit card module and the backplane. Typically, the interconnector component physically couples the circuit card module and backplane together and electrically couples the electrically conductive pads.

As circuit card modules become more densely populated with heat generating components, such as processors, multichip modules (MCMs), radio frequency (RF), photonic devices and field-programmable gate arrays (FPGAs), the dissipation of the heat generated has become increasingly more important. One heat dissipation approach, which has been used in a variety of applications, including electronic circuit card modules, has been to use convection cooling techniques. With convection cooling, the circuit card modules may be mounted in the electronic device in a way that permits cooling air to flow over the circuit boards. For proper convection cooling, an adequate cooling airflow over a sufficiently exposed surface of the circuit board should be provided. Such arrangements may be incompatible, however, with some uses of circuit card modules where cooling air is not available or space is not available to allow adequate airflow over heat dissipating components.

An alternative approach is to dissipate heat through conduction. In this application, heat is transferred via a heat sink positioned on one surface of the circuit board and in contact with components on the circuit board. The heat sink includes a flange extending beyond the sides of the circuit board allowing for attachment to the cold wall of the electronic device chassis. Typically wedge lock retainer devices are used to make the connection between the heat sink flanges and the electronic device chassis. This conduction approach is the basis of industry standards such as VITA 48.2 and IEEE 1101.2. Advancements in heat management technology, such as heat sinks embedded with pyrolytic graphite and heat pipes, have been used to address increasing heat dissipation demands. However, the thermal resistance created by the wedge lock retainer devices make them a less efficient method and a limiting factor in conducting high heat loads away from circuit boards.

SUMMARY

Generally, an electronic device may include an electronic device chassis having a plurality of first fastener openings therein, and a plurality of circuit boards. Each circuit board has opposing sides. The electronic device may include a respective heat sink flange extending outwardly from each opposing side of each circuit board. Each heat sink flange may have a plurality of second fastener openings therein. The electronic device may comprise a respective fastening arrangement coupling each heat sink flange to adjacent portions of the electronic device chassis. Each fastening arrangement may include a fastener receiving strip having a plurality of fastener receiving passageways therein, and a plurality of fasteners extending through respective ones of the pluralities of first and second fastener openings into corresponding ones of the plurality of fastener receiving passageways in the fastener receiving strip.

The electronic device may also include a plurality of heat sink supports respectively carrying the plurality of circuit boards. Each heat sink support may be coupled to the respective heat sink flange. Each heat sink support may include a heat sink plate having first and second major surfaces, the first major surface being adjacent a respective circuit board, and may include at least one heat pipe extending along the second major surface of the heat sink plate. Each heat sink flange may be canted at an angle between 30 and 60 degrees with a respective circuit board.

In some embodiments, each fastener may comprise a threaded screw, for example. Also, each fastener receiving passageway may also be threaded and may cooperate with the threaded screw to clamp the respective heat sink flange. Each fastener receiving passageway may define a fastener receiving blind passageway, and when the threaded screw is received by the fastener receiving blind passageway, the threaded screw may define a recess in the fastener receiving blind passageway.

Additionally, the plurality of fasteners may be spaced apart along the opposing sides of each circuit board. Each circuit board may comprise at least one circuit, and a backplane electrical interface coupled to the at least one circuit. Each respective fastening arrangement may comprise at least one of a metallic material and a thermally conductive material, for example.

Another aspect is directed to a method of making an electronic device. The method may include providing an electronic device chassis having a plurality of first fastener openings therein, and providing a plurality of circuit boards, each circuit board having opposing sides. The method may comprise providing a respective heat sink flange extending outwardly from each opposing side of each circuit board. Each heat sink flange may have a plurality of second fastener openings therein. The method may also include coupling each heat sink flange to adjacent portions of the electronic device chassis with a respective fastening arrangement. Each fastening arrangement may include a fastener receiving strip having a plurality of fastener receiving passageways therein, and a plurality of fasteners extending through respective ones of the pluralities of first and second fastener openings into corresponding ones of the plurality of fastener receiving passageways in the fastener receiving strip.

BRIEF DESCRIPTION OF THE DRAWINGS

FIG. 3A is a schematic top plan view of the electronic device of FIG. 1.

DETAILED DESCRIPTION

Figure 1:
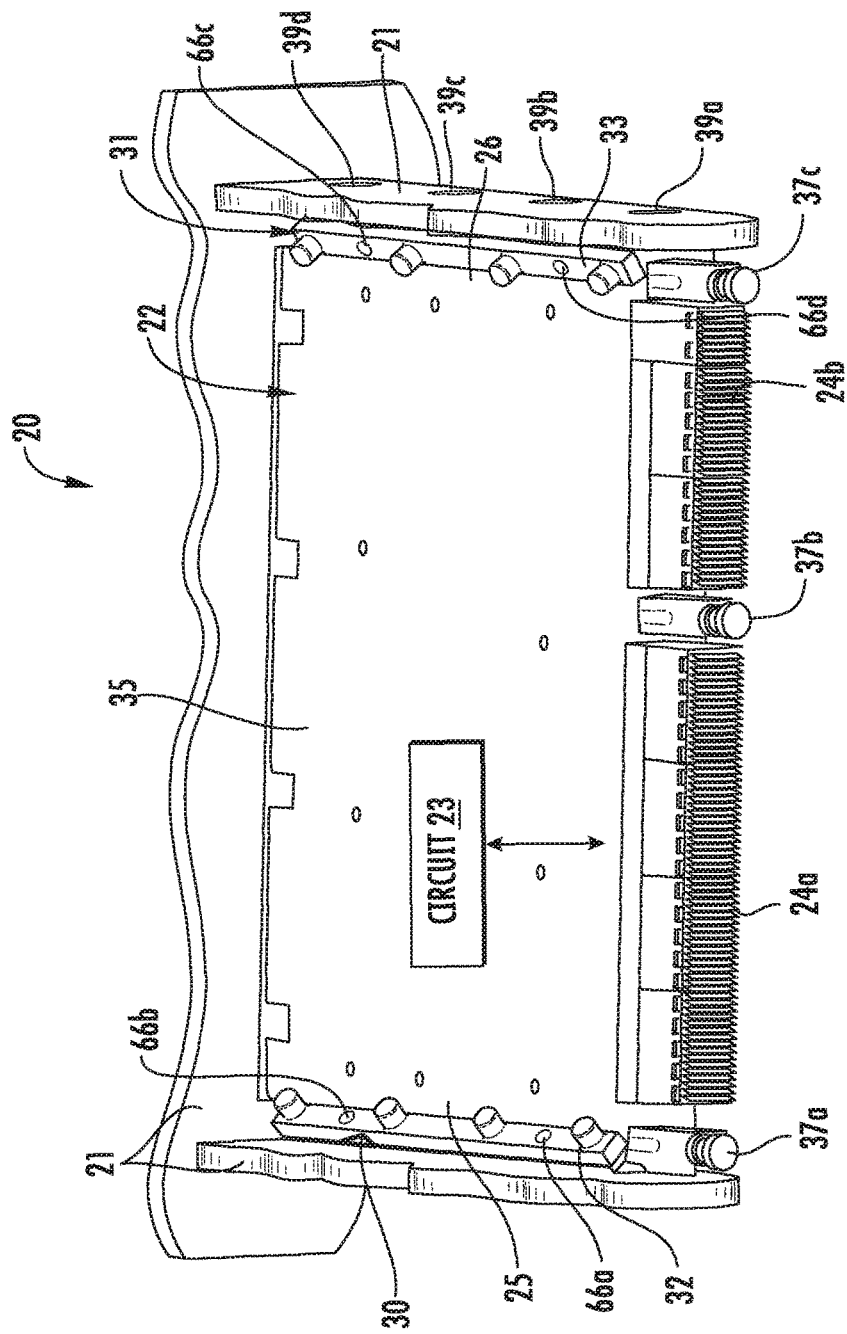
FIG. 1 is a schematic perspective view of an electronic device, according to the present disclosure.

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and base 100 reference numerals are used to indicate similar elements in alternative embodiments.

In view of the foregoing background, it is therefore an object of the present invention to provide a more efficient connection method between the circuit card module heat sink and the electronic device chassis.

Referring initially to FIGS. 1-4, an electronic device 20 according to the present disclosure is now described. The electronic device 20 illustratively includes an electronic device chassis 21, and a circuit board 22 carried within the electronic device chassis. In the illustrated embodiment, the electronic device 20 only includes a single circuit board 22 for illustrative clarity, but may comprise more than one in other embodiments. The electronic device chassis 21 may comprise a metallic material, but may comprise other alternative or additional materials with sufficient thermal conductivity and mechanical strength.

Although not shown, the electronic device 20 includes a backplane circuit board extending vertically. Each circuit board 22 illustratively includes a dielectric substrate 35, at least one circuit 23 carried by the dielectric substrate, and a plurality of conductive traces coupled to the at least one circuit. Each circuit board 22 illustratively includes a backplane electrical interface 24a-24b coupled to the at least one circuit 23 and configured to be received by the backplane circuit board. Each circuit board 22 illustratively includes a plurality of alignment guide pin sockets 37a-37c to align the electrical interface via alignment pins on the backplane circuit board. Each circuit board 22 illustratively has opposing sides 25, 26.

The electronic device 20 illustratively includes a respective heat sink flange 27, 28 extending outwardly from each opposing side 25, 26 of each circuit board 22. Also, the electronic device chassis 21 illustratively has a plurality of first fastener openings 38a-38d, 39a-39d therein. Each heat sink flange 27, 28 illustratively includes a plurality of second fastener openings 29a-29d, 40a-40d therein. The electronic device 20 illustratively includes a respective fastening arrangement 30, 31 coupling each heat sink flange 27, 28 to adjacent portions of the electronic device chassis 21. Each heat sink flange 27, 28 may be canted at an angle between 30 and 60 degrees with a respective circuit board 22. The ideal angle is about 45 (±2) degrees as angles greater than 45 degrees may increase interface alignment tolerance issues, and angles less than 45 degrees may increase circuit card module spacing and chassis interface complexity.

Each fastening arrangement 30, 31 illustratively includes a fastener receiving strip 32, 33. Each fastener receiving strip 32, 33 illustratively includes a plurality of fastener receiving passageways 34a-34d therein, and a plurality of mounting fastener passageways 66a-66d.

Each fastening arrangement 30, 31 illustratively includes a plurality of fasteners 36. For illustrative clarity only one fastener 36 is depicted, but is should be appreciated that each of the eight fasteners in this embodiment are similarly constituted. Moreover, additional fasteners (e.g. screws or rivets) would be inserted though the mounting fastener passageways 66a-66d to mount the fastener receiving strip 32, 33 onto the heat sink flange 27, 28. The plurality of fasteners 36 illustratively extends through respective ones of the pluralities of first and second fastener openings 38a-38d, 39a-39d; 29a-29d, 40a-40d into corresponding ones of the plurality of fastener receiving passageways 34a-34d in the fastener receiving strip 32, 33. In the illustrated embodiment, the pluralities of first and second fastener openings 38a-38d, 39a-39d, 29a-29d, 40a-40d may be slotted 68 to accommodate lateral movement of the fastener 36 due to chassis to heat sink flange alignment tolerance as a user tightens the electronic device chassis 21 to heat sink flange 27, 28. Moreover, each fastener receiving strip 32, 33 can be loosely mounted to the heat sink flange 27, 28 to allow lateral movement to assist in fastener 26 alignment and movement as the user tightens the electronic device chassis 21 to heat sink flange 27, 28.

Also, the fastening strip 32, 33 is used to provide additional stiffening of heat sink flange 27, 28 and allows for a blind interface for the fastener 36 to eliminate foreign object debris (FOD) (i.e. metal wear fragments from fastener threads) and if loosely mounted can float some to assist in alignment and simplify interface tolerancing. In an alternative embodiment, the heat sink flange 27, 28 would be machined with this feature if FOD and interface tolerancing are not an issue.

Advantageously, the plurality of fasteners 36 provide a solid mechanical connection to the fastener receiving strip 32, 33. This solid mechanical connection provides for an effective high thermal conductivity interface pressure coupling between the respective heat sink flange 27, 28 and the electronic device chassis 21, which reduces thermal resistance. Indeed, the bolted interface of the illustrated embodiment provides the lowest thermal resistance short of a permanent brazing approach. Moreover, the bolted interface is resistant to mechanical degradation in robust mechanical (i.e. substantial vibration or shock) and dynamic thermal environments. Also, the bolted interface is quite scalable (i.e. readily absorbing greater power loads from the circuit board 22) by simply adding more fasteners and increasing heat sink flange length.

Moreover, the pluralities of first and second fastener openings 38a-38d, 39a-39d; 29a-29d, 40a-40d are slotted in shape, which permits greater tolerance for rail positioning in the electronic device chassis 21. In other words, this reduces the precision needed to manufacture and machine the electronic device chassis 21 and heat sink flange 27, 28.

Additionally, the plurality of fasteners 36 is illustratively spaced apart along the opposing sides 25, 26 of each circuit board 22. In the illustrated embodiment, each fastener 36 comprises a threaded screw. Also, each fastener receiving passageway 34a-34d is also illustratively threaded and cooperates with the threaded screw to clamp the respective heat sink flange 27, 28. Each fastener receiving passageway 34a-34d may define a fastener receiving blind passageway, and when the threaded screw is received by the fastener receiving blind passageway, the threaded screw may define a recess 43 in the fastener receiving blind passageway. Helpfully, the recess 43 may prevent debris from entering the circuit board 22 active areas.

Figure 3B:
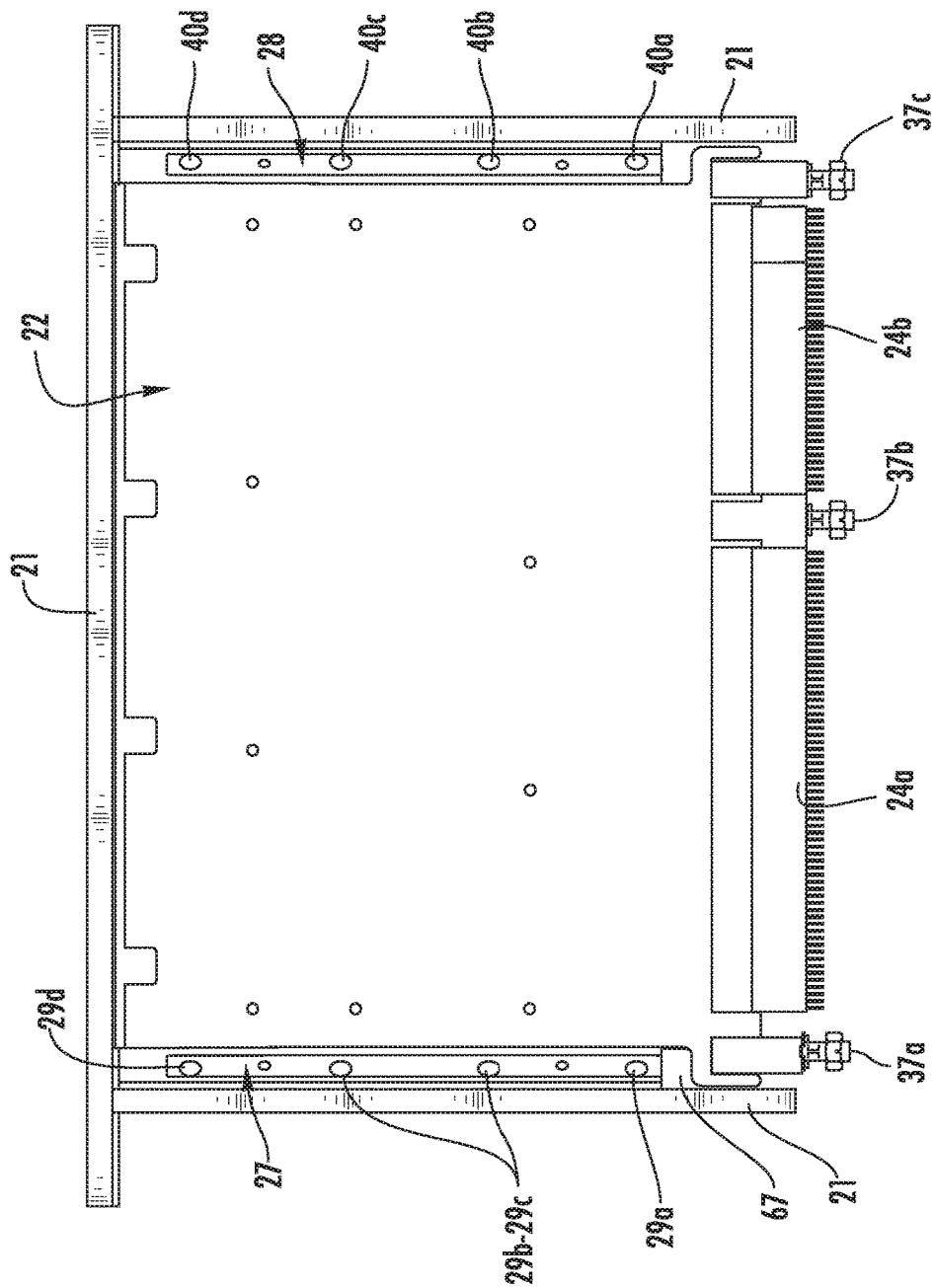
FIG. 3B is a schematic top plan view of the electronic device of FIG. 1 with the fastener receiving strip removed.
Figure 3C:
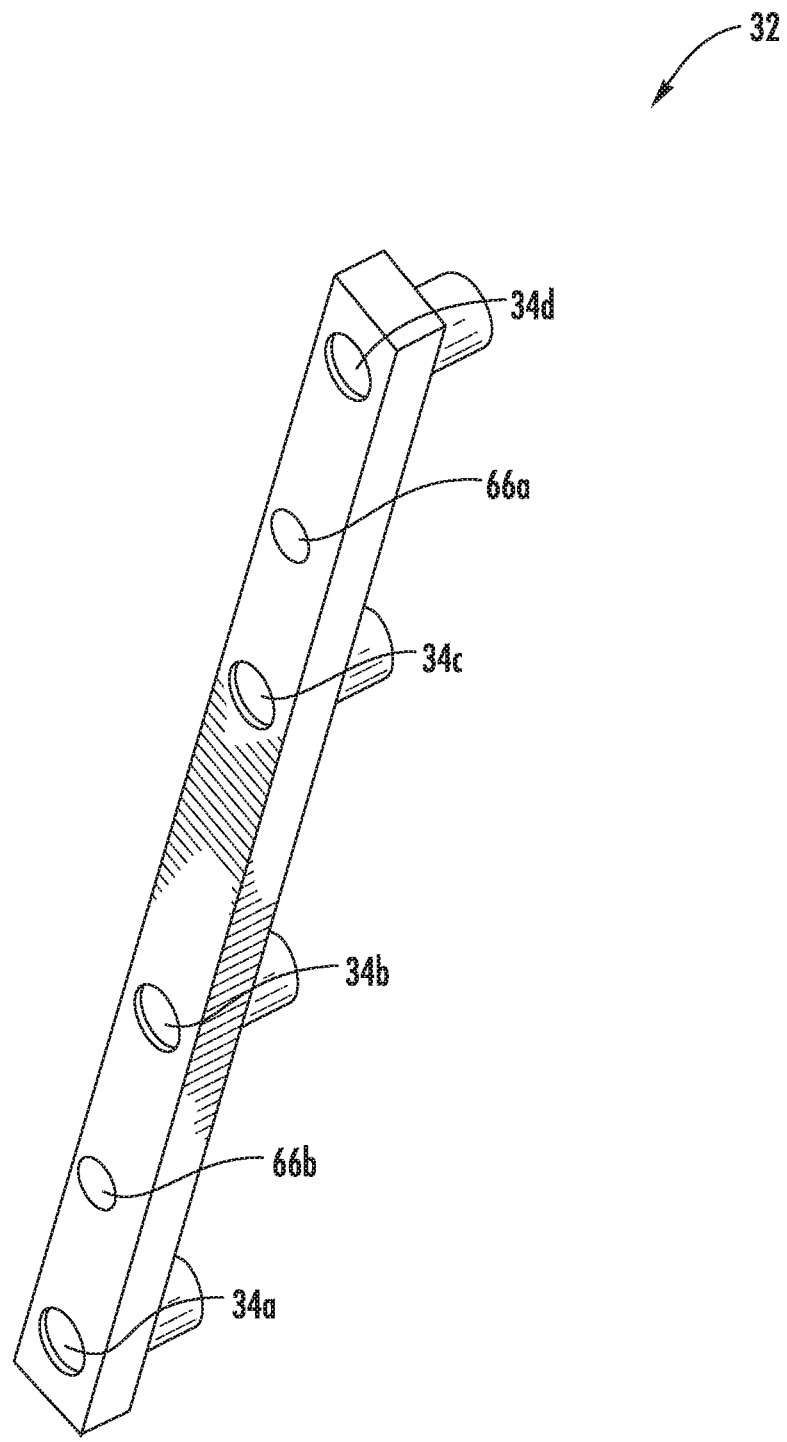
FIG. 3C is a schematic perspective view of the fastener receiving strip from the electronic device of FIG. 1.

As perhaps best seen in FIG. 3C, each fastener receiving strip 32, 33 illustratively includes a block-shaped base, and a plurality of cylinder-shaped heads extending from the base opposite openings in the plurality of fastener receiving passageways 34a-34d. In some embodiments, the fastener receiving strip 32, 33 may omit the plurality of cylinder-shaped heads. In these embodiments, there is no recess for debris and each fastener receiving passageway 34a-34d defines a through passageway.

As perhaps best seen in FIG. 3A, the chassis 21 may include a protrusion 67a-67b that provides a positive stop for the heat sink flange 27, 28 to assist in aligning fastener openings.

Each respective fastening arrangement 30, 31 may comprise a metallic material (e.g. copper, aluminum). Of course, as with the electronic device chassis 21, the respective fastening arrangement 30, 31 may comprise other alternative or additional materials with sufficient thermal conductivity and mechanical strength.

Figure 2:
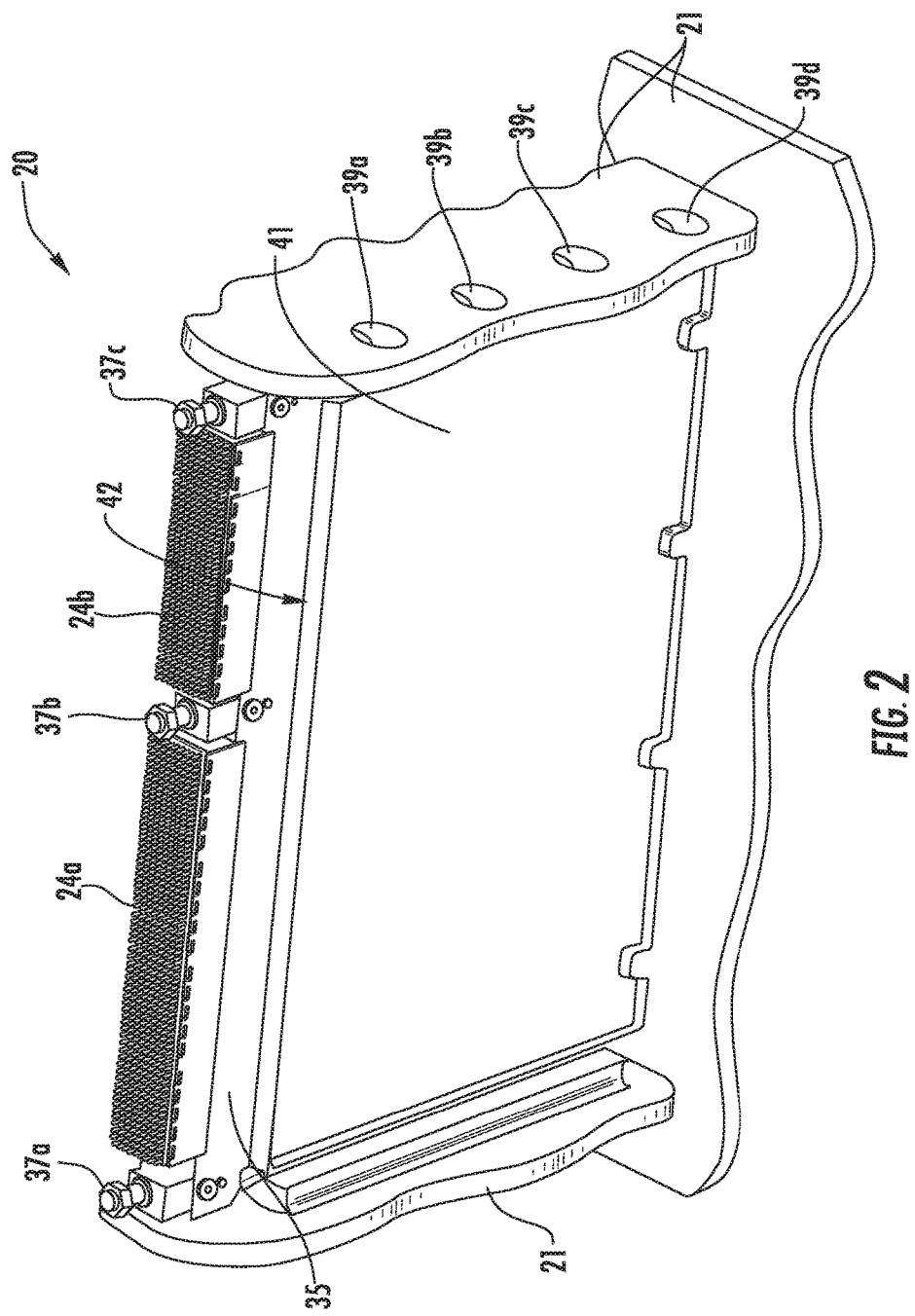
FIG. 2 is another schematic perspective view of the electronic device of FIG. 1.

As perhaps best seen in FIG. 2, each heat sink support 42 illustratively includes a heat sink plate 41 having first and second major surfaces. The first major surface of the heat sink plate 41 is adjacent a respective circuit board 22. In some embodiments, the heat sink plate 41 and the respective circuit board 22 may be laminated together with a dielectric adhesive with sufficient thermal conductivity. In other embodiments, the heat sink plate 41 and the respective circuit board 22 may be fastened using threaded screws together with an interposed dielectric interface material with sufficient thermal conductivity.

The electronic device 20 illustratively includes a heat sink support 42 coupled to the heat sink plate 41 respectively carrying the circuit board 22. For illustrative clarity, the heat sink support 42 around the periphery of the plate is shown, but the electronic device 20 may include additional ones.

Each heat sink support 42 and heat sink plate 41 is coupled to the respective heat sink flange 27, 28. In some embodiments, the heat sink support 42 and heat sink plate 41 and the respective heat sink flanges 27, 28 are integral, but in other embodiments, they may be separate components affixed together via an adhesive, for example.

In the illustrated embodiment, the at least one circuit 23 is mounted facing upward. In other embodiments (not shown), the at least one circuit 23 may be mounted facing downward in orientation and mounted to the dielectric substrate 35. The circuit board 22 may be mounted to the heat sink plate 41 via a standoff with the gap between the circuit and the plate filled with a dielectric material of sufficient thermal conductivity.

Figure 4:
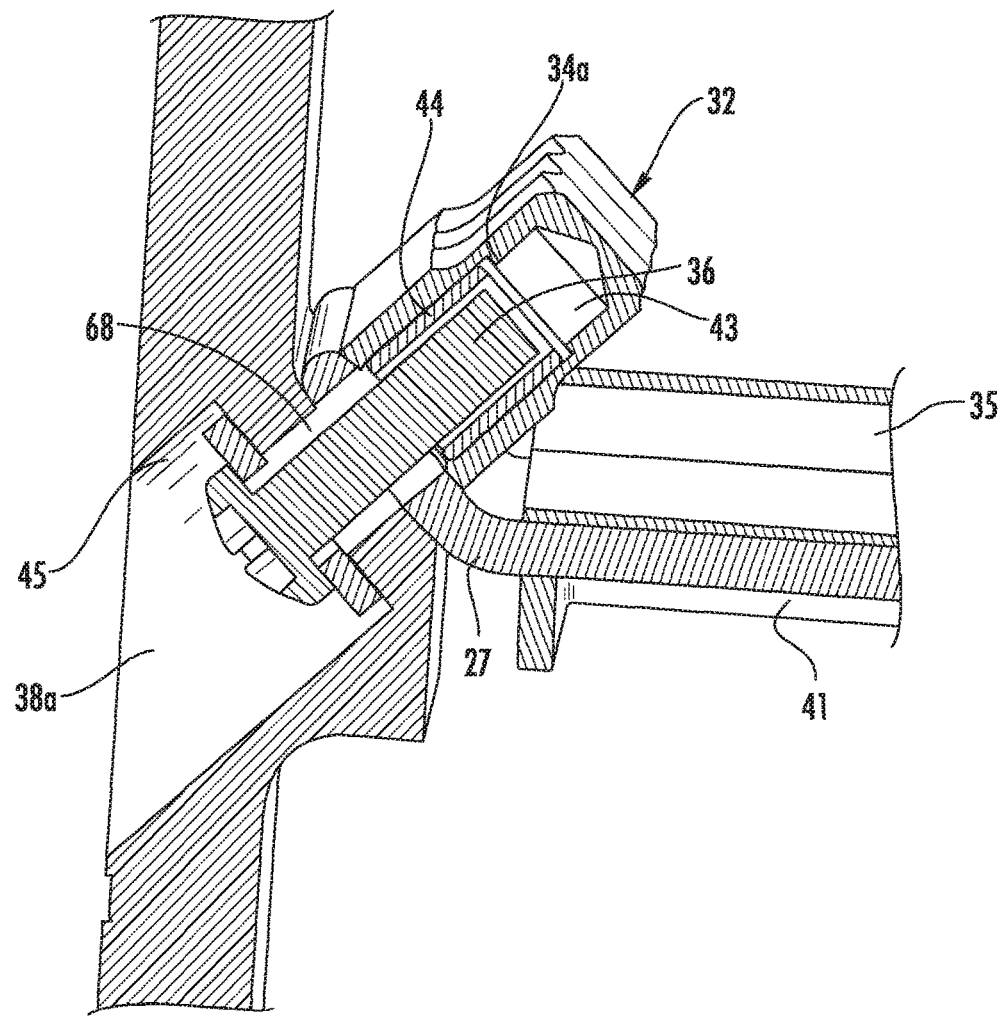
FIG. 4 is a schematic partial cross-section view of the electronic device of FIG. 1 along line 4-4.

As perhaps best seen in FIG. 4, each fastening arrangement 30, 31 illustratively includes a threaded bushing 44 attached (e.g. a helicoil) within each fastener receiving passageway 34a-34d, thereby defining the threading of the fastener receiving passageway. Also, each fastening arrangement 30, 31 illustratively includes a washer 45, and the fastener 36 is inserted through the washer.

Another aspect is directed to a method of making an electronic device 20. The method includes providing an electronic device chassis 21 having a plurality of first fastener openings 38a-38d, 39a-39d therein, and one or more circuit boards 22. Each circuit board 22 has opposing sides 25, 26. The method includes providing a respective heat sink flange 27, 28 extending outwardly from each opposing side 25, 26 of each circuit board 22, each heat sink flange having a plurality of second fastener openings 29a-29d, 40a-40d therein. The method also includes coupling each heat sink flange 27, 28 to adjacent portions of the electronic device chassis 21 with a respective fastening arrangement 30, 31. Each fastening arrangement 30, 31 includes a fastener receiving strip 32, 33 having a plurality of fastener receiving passageways 34a-34d therein, and a plurality of fasteners 36 extending through respective ones of the pluralities of first and second fastener openings 38a-38d, 39a-39d; 29a-29d, 40a-40d into corresponding ones of the plurality of fastener receiving passageways 34a-34d in the fastener receiving strip.

Figure 5:
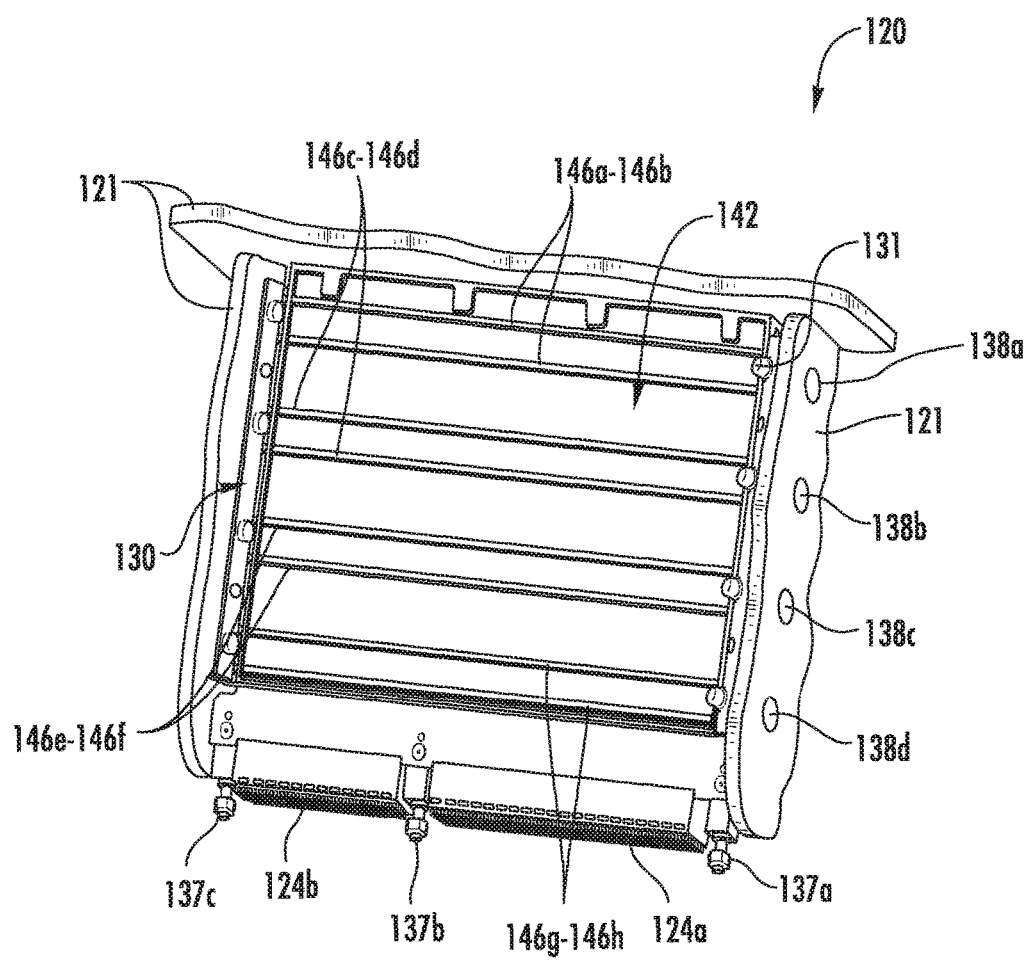
FIG. 5 is a schematic perspective view of another embodiment of the electronic device, according to the present disclosure.
Figure 6:
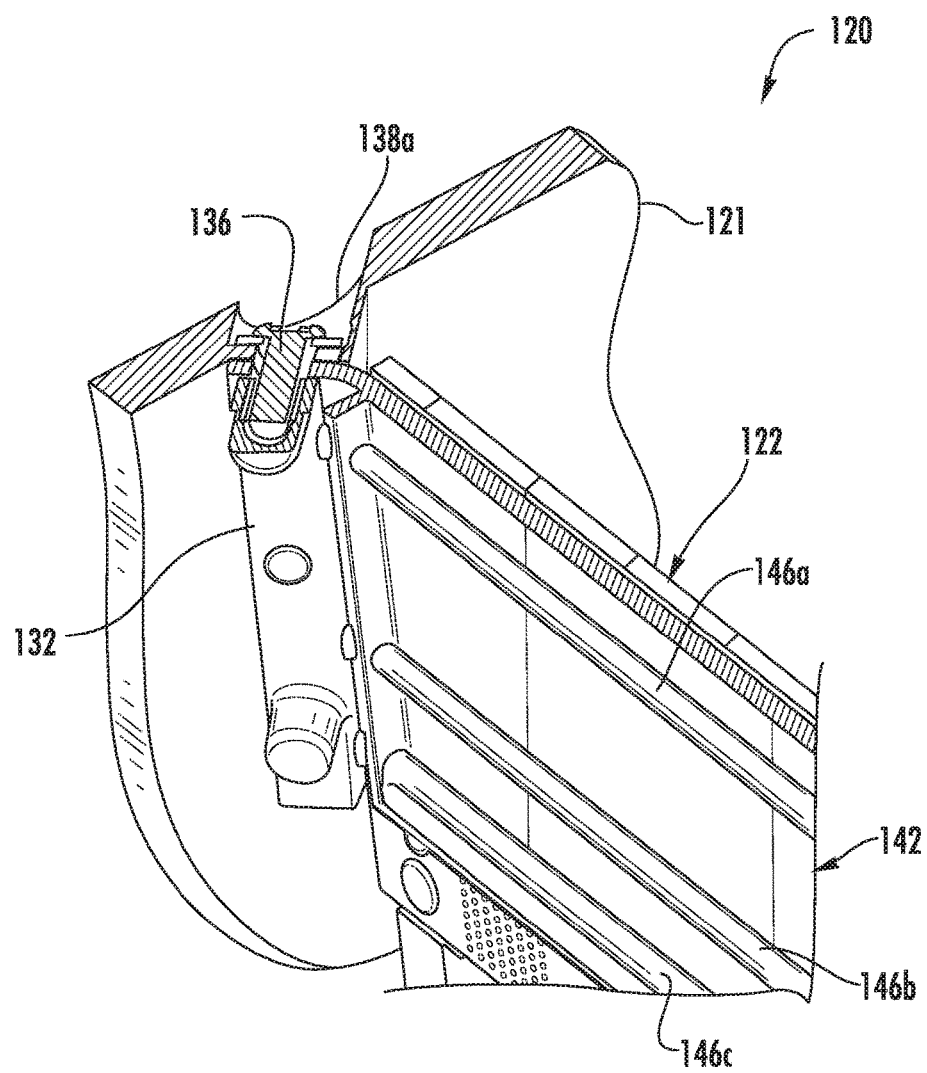
FIG. 6 is a schematic partial perspective view of yet another embodiment of the electronic device, according to the present disclosure.

Referring now to FIGS. 5-6, another embodiment of the electronic device 120 is now described. In this embodiment of the electronic device 120, those elements already discussed above with respect to FIGS. 1-4 are incremented by 100 and most require no further discussion herein. This embodiment differs from the previous embodiment in that each heat sink support 142 illustratively includes a heat sink plate 141 having first and second major surfaces. The first major surface is adjacent a respective circuit board 122. Here, each heat sink support 142 includes a plurality of heat pipe pairs 146a-146h extending along the second major surface of the heat sink plate 141. In this embodiment, each heat pipe pair 146a-146h is centered about a respective fastener receiving passageway 134a-134d in the fastener receiving strip 130, 131. Also, in this embodiment, the fastener receiving strip 130, 131 can be machined to allow protruding items like heat pipe 146a-146h to extend underneath without damaging them when fastened. In prior approaches with wedge lock retainer devices, this may not be possible.

As perhaps best seen in FIG. 6, the electronic device 120 illustratively includes a plurality of heat pipes 146a-146c extending along the second major surface of the plate. At least some of the heat pipes 146a-146c are aligned and centered onto a respective fastener receiving passageway 134a-134d in the fastener receiving strip 132, 131.

Advantageously, in the embodiment of FIGS. 5-6, the heat pipe design is quite simple and readily manufactured. Also, given the cant of the respective heat sink flange 127, 128, the plurality of heat pipes 146a-146c can run adjacent or even abutting to the rail of the electronic device chassis 121 without interface issues.

Figure 7:
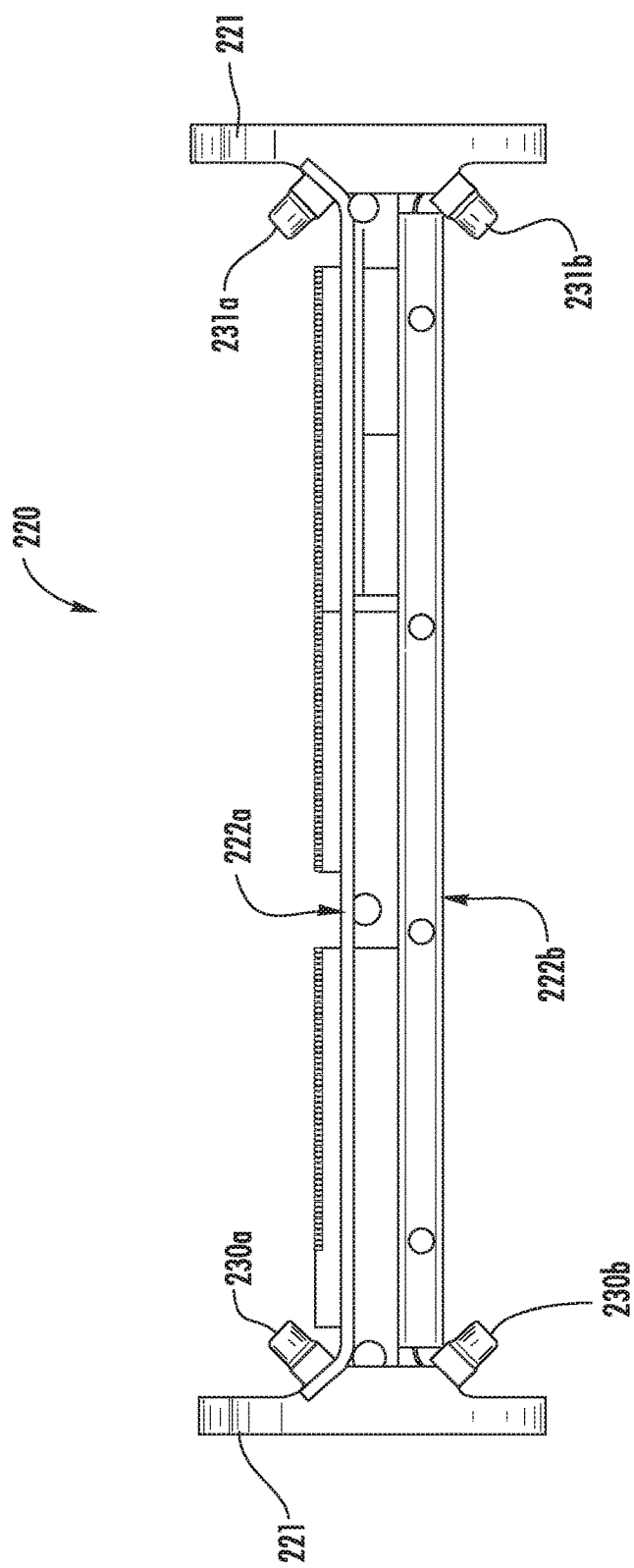
FIG. 7 is a schematic side elevational view of another embodiment of the electronic device, according to the present disclosure.
Figure 8B:
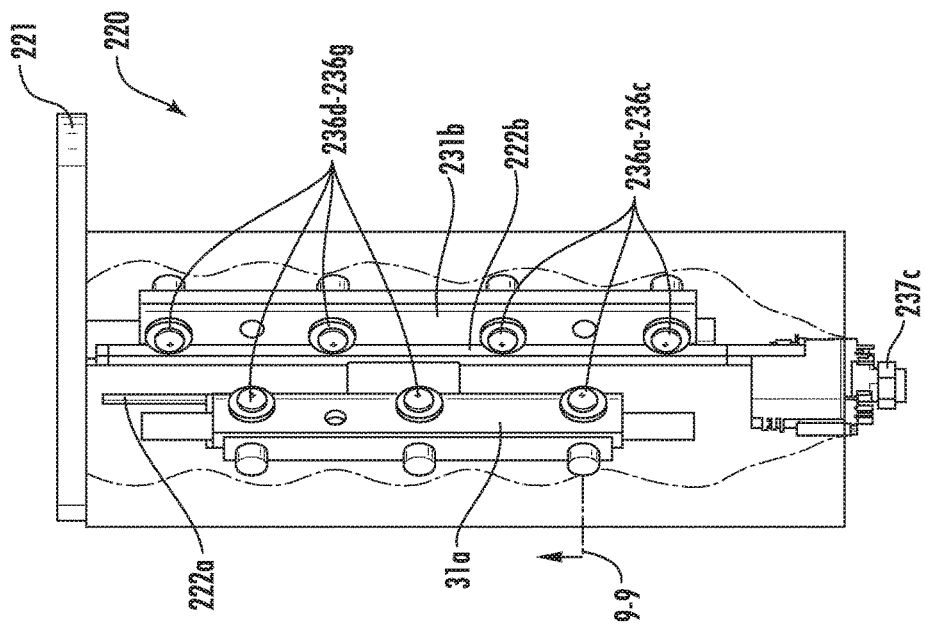
FIG. 8B is a schematic side elevational view of the electronic device of FIG. 7 with portions of the electronic device chassis removed.
Figure 8A:
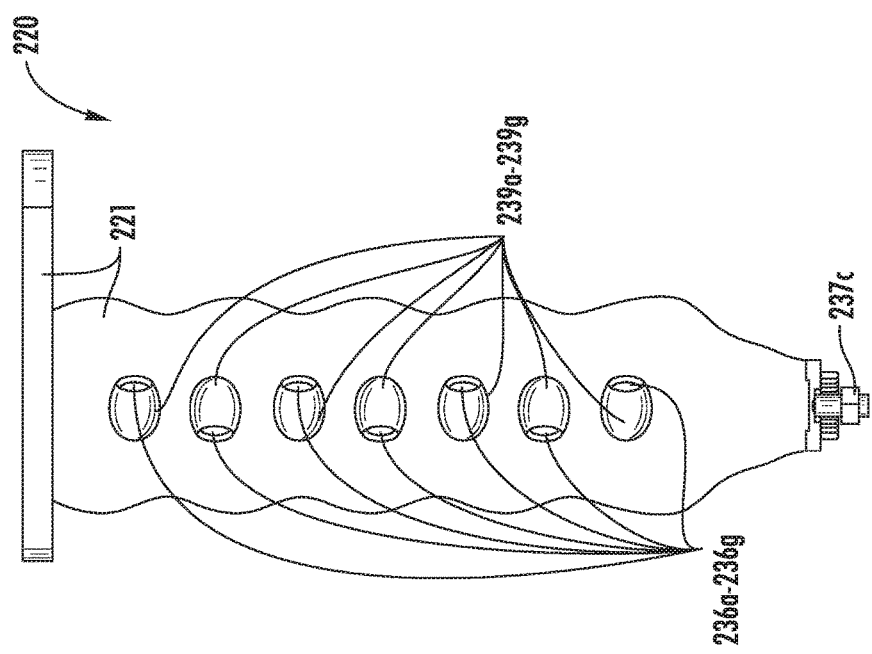
FIG. 8A is a schematic side elevational view of the electronic device of FIG. 7.
Figure 9:
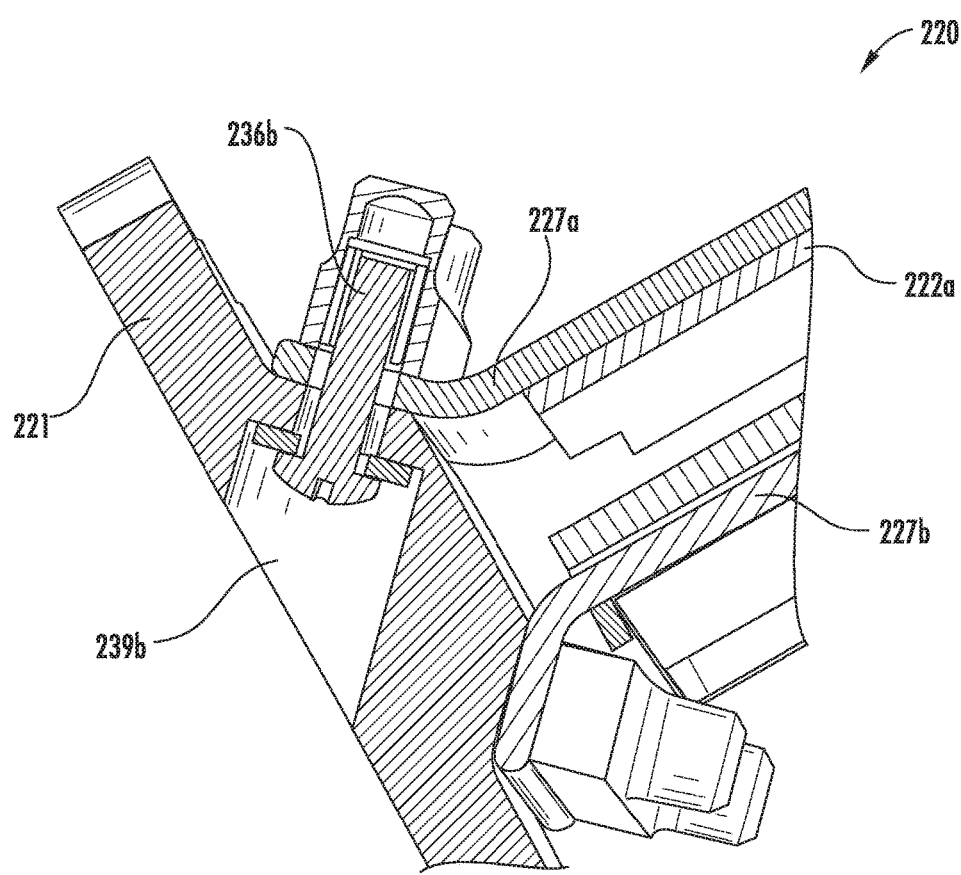
FIG. 9 is a schematic partial cross-section view of the electronic device of FIG. 7 along line 9-9.

Referring now to FIGS. 7-9, another embodiment of the electronic device 220 is now described. In this embodiment of the electronic device 220, those elements already discussed above with respect to FIGS. 1-4 are incremented by 200 and most require no further discussion herein. This embodiment differs from the previous embodiment in that this electronic device 220 illustratively includes a host circuit board 222a, and a mezzanine circuit board 222b. The mezzanine circuit board 222b is carried by the host card assembly in a spaced relation therefrom. As perhaps best seen in FIGS. 8A, 8B, & 9, the respective heat sink flanges 227a, 227b are canted in opposite directions to permit fitment against adjacent portions of the electronic device chassis 221. Also, for similar mechanical reasons, the plurality of fasteners 236a-236g are staggered/interleaved between the host and mezzanine circuit boards 222a-222b. Helpfully, this embodiment is capable of dissipating twice the power of the prior embodiments for circuit card modules containing plurality of primary and mezzanine circuit boards.

In typical prior art approaches for attaching circuits boards to the electronic device chassis, such as the wedge lock retainer device, power dissipation performance was less than desirable. This poor performance aspect in combination with increasing integrated circuit (IC) functionality and IC density may create a design hurdle. In some rugged industrial and aerospace applications, power dissipation is accomplished via thermal conduction, and the primary thermal choke point (i.e. point of low thermal conduction or point of high thermal resistance) is at the circuit board side interface to the electronic device chassis.

The reason for this thermal choke point is the poor contact conductance of the wedge lock device. In these same applications, active air or fluid cooling are not practical and are rather complex due to the number of circuit boards in the electronic device chassis. Yet further, the typical wedge lock retainer devices are relatively expensive, have too much thermal resistance to permit greater power loads in the circuit boards, and experience degradation in contact pressure when subjected robust environments such as vibration, shock and thermal cycling.

Figure 10:
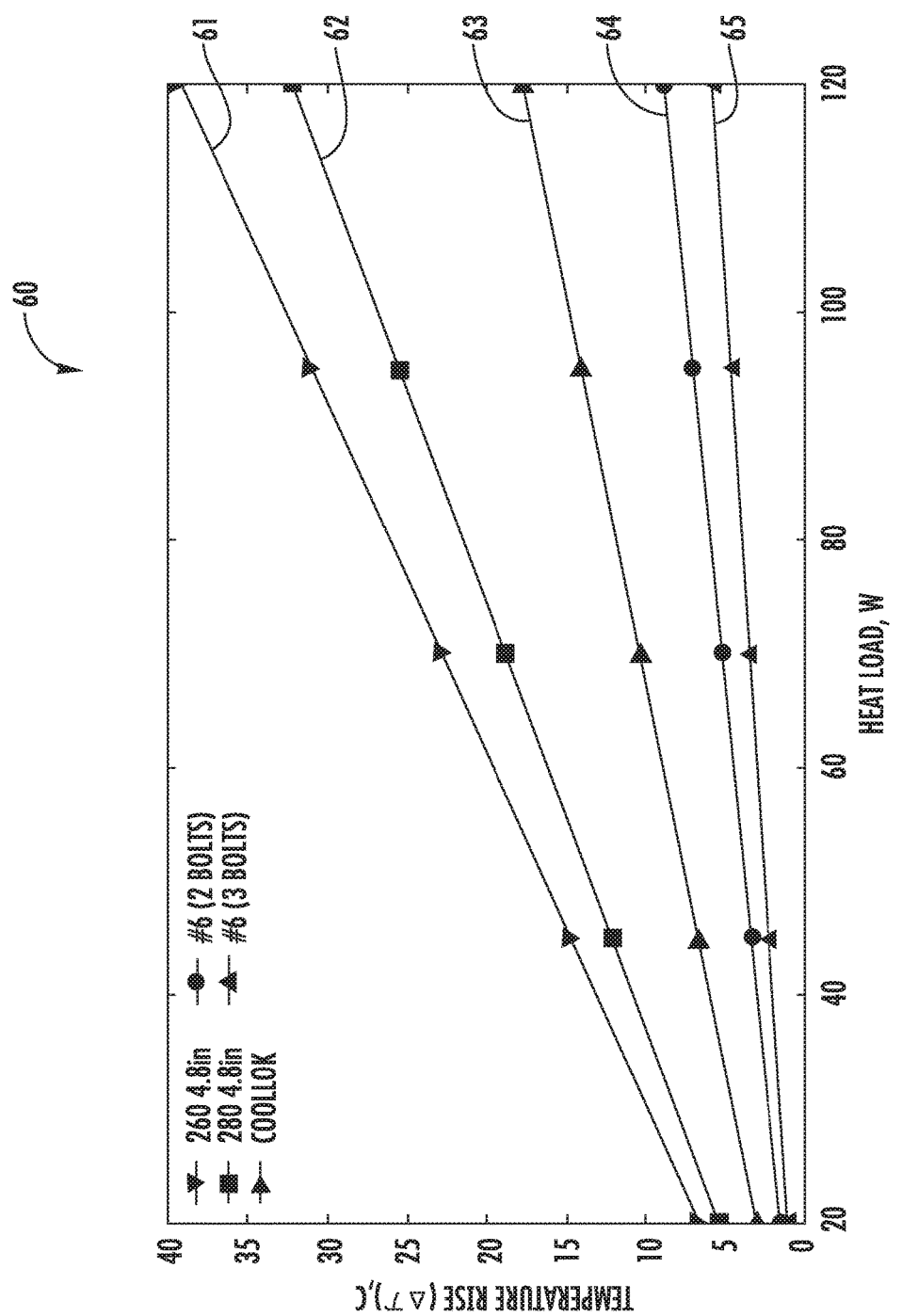
FIG. 10 is a diagram of temperature versus heat load for the electronic device, according to the present disclosure.

Referring now additionally to FIG. 10, a diagram 60 illustrates heat load performance for an example embodiment of electronic device 20 as compared to typical prior art approaches. In particular, curve 65 relates to the example embodiment of electronic device 20, and curves 61-64 relate to varying prior art approaches. Advantageously, the example embodiment of electronic device 20 only experiences a 5 degree Celsius increase in temperature with a heat load of 120 watts. On the other hand, the varying prior art approaches experience up to 35 degrees Celsius in temperature increase with similar heat load.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. An electronic device comprising:
an electronic device chassis having a plurality of first fastener openings therein;
a plurality of circuit boards, each circuit board having opposing sides;
a respective heat sink flange extending outwardly from each opposing side of each circuit board, each heat sink flange having a plurality of second fastener openings therein; and
a respective fastening arrangement coupling each heat sink flange to adjacent portions of said electronic device chassis, each fastening arrangement comprising
a fastener receiving strip having a plurality of fastener receiving passageways therein, and
a plurality of fasteners extending through respective ones of the pluralities of first and second fastener openings into corresponding ones of said plurality of fastener receiving passageways in said fastener receiving strip.

2. The electronic device of claim 1 wherein said plurality of fasteners have respective heads being exposed through said electronic device chassis to permit unobstructed access.

3. The electronic device of claim 1 further comprising a plurality of heat sink supports respectively carrying said plurality of circuit boards, each heat sink support being coupled to said respective heat sink flange.

4. The electronic device of claim 3 wherein each heat sink support comprises:
a heat sink plate having first and second major surfaces, the first major surface being adjacent a respective circuit board; and
at least one heat pipe extending along said second major surface of said heat sink plate.

5. The electronic device of claim 1 wherein each heat sink flange is canted at an angle between 30 and 60 degrees with a respective circuit board.

6. The electronic device of claim 1 wherein each fastener comprises a threaded screw; and wherein each fastener receiving passageway is also threaded and cooperates with the threaded screw to clamp the respective heat sink flange.

7. The electronic device of claim 6 wherein each fastener receiving passageway defines a fastener receiving blind passageway; and wherein when said threaded screw is received by said fastener receiving blind passageway, said threaded screw defines a recess in said fastener receiving blind passageway.

8. The electronic device of claim 1 wherein said plurality of fasteners is spaced apart along said opposing sides of each circuit board.

9. The electronic device of claim 1 wherein each circuit board comprises at least one circuit, and a backplane electrical interface coupled to said at least one circuit.

10. The electronic device of claim 1 wherein each respective fastening arrangement comprises at least one of a metallic and a thermally conductive material.

11. An electronic device comprising:
an electronic device chassis having a plurality of first fastener openings therein;

a plurality of circuit boards, each circuit board having opposing sides;

a respective heat sink flange extending outwardly from each opposing side of each circuit board, each heat sink flange having a plurality of second fastener openings therein;

a plurality of heat sink supports respectively carrying said plurality of circuit boards, each heat sink support being coupled to said respective heat sink flange; and a respective fastening arrangement coupling each heat sink flange to adjacent portions of said electronic device chassis, each fastening arrangement comprising a fastener receiving strip having a plurality of fastener receiving passageways therein, and a plurality of threaded screws extending through respective ones of the pluralities of first and second fastener openings into corresponding ones of said plurality of fastener receiving passageways in said fastener receiving strip.

12. The electronic device of claim 11 wherein each heat sink support comprises:

a heat sink plate having first and second major surfaces, the first major surface being adjacent a respective circuit board; and at least one heat pipe extending along said second major surface of said heat sink plate.

13. The electronic device of claim 11 wherein each heat sink flange is canted at an angle between 30 and 60 degrees with a respective circuit board.

14. The electronic device of claim 11 wherein each fastener receiving passageway is also threaded and cooperates with each threaded screw to clamp the respective heat sink flange.

15. The electronic device of claim 11 wherein each fastener receiving passageway defines a fastener receiving blind passageway; and wherein when each threaded screw is received by said fastener receiving blind passageway, each threaded screw defines a recess in said fastener receiving blind passageway.

16. The electronic device of claim 11 wherein said plurality of threaded screws is spaced apart along said opposing sides of each circuit board.

17. The electronic device of claim 11 wherein each circuit board comprises at least one circuit, and a backplane electrical interface coupled to said at least one circuit.

18. A method of making an electronic device comprising:

providing an electronic device chassis having a plurality of first fastener openings therein, and a plurality of circuit boards, each circuit board having opposing sides;

providing a respective heat sink flange extending outwardly from each opposing side of each circuit board, each heat sink flange having a plurality of second fastener openings therein; and coupling each heat sink flange to adjacent portions of the electronic device chassis with a respective fastening arrangement, each fastening arrangement comprising a fastener receiving strip having a plurality of fastener receiving passageways therein, and a plurality of fasteners extending through respective ones of the pluralities of first and second fastener openings into corresponding ones of the plurality of fastener receiving passageways in the fastener receiving strip.

19. The method of claim 18 further comprising a plurality of heat sink supports respectively carrying the plurality of circuit boards, each heat sink support being coupled to the respective heat sink flange.

20. The method of claim 19 wherein each heat sink support comprises:

a heat sink plate having first and second major surfaces, the first major surface being adjacent a respective circuit board; and at least one heat pipe extending along the second major surface of the heat sink plate.

21. The method of claim 18 wherein each heat sink flange is canted at an angle between 30 and 60 degrees with a respective circuit board.

\* \* \* \* \*